United States Patent
Bielas et al.

(10) Patent No.: US 7,532,863 B2
(45) Date of Patent: May 12, 2009

(54) BROADBAND WIRELESS AD-HOC MODEM AND NETWORK TESTBED

(75) Inventors: Michael S. Bielas, Tucson, AZ (US); Mathew R. Danner, Tucson, AZ (US); Brian T. MacIntosh, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 745 days.

(21) Appl. No.: 10/972,873

(22) Filed: Oct. 25, 2004

(65) Prior Publication Data

US 2007/0052435 A1    Mar. 8, 2007

(51) Int. Cl.
*H04B 17/00*    (2006.01)
*H04W 24/00*    (2009.01)

(52) U.S. Cl. ............... 455/67.11; 455/67.14; 455/423; 455/424

(58) Field of Classification Search ... 455/67.11–67.14, 455/423, 424, 425, 115.1, 115.2, 226.1, 249.1; 370/241, 222, 257, 258
See application file for complete search history.

(56) References Cited

U.S. PATENT DOCUMENTS

| | | | |
|---|---|---|---|
| 5,790,523 A | 8/1998 | Ritchie, Jr. et al. | |
| 6,148,379 A * | 11/2000 | Schimmel | 711/152 |
| 6,724,730 B1 | 4/2004 | Mlinarsky et al. | |
| 7,008,263 B2 * | 3/2006 | Holland | 439/578 |
| 7,039,361 B1 * | 5/2006 | Collins | 455/63.1 |
| 2005/0272367 A1 * | 12/2005 | Rodgers et al. | 455/11.1 |

* cited by examiner

*Primary Examiner*—Eugene Yun
(74) *Attorney, Agent, or Firm*—Renner, Otto, Boisselle, & Sklar LLP (57) ABSTRACT

A testbed is provided for testing broadband wireless test units. The testbed includes an enclosure and a plurality of I/O connectors accessible externally of the enclosure. Each of the I/O connectors is for being electrically coupled to a respective test unit. A series of connections within the enclosure serve to interconnect the plurality of I/O connectors as respective nodes in a bus-mesh network topology.

19 Claims, 5 Drawing Sheets

BROADBAND WIRELESS AD-HOC MODEM AND NETWORK TESTBED

This invention was made with Government support under DAAH01-98-C-R132/P00073 awarded by The Department of Army. The Government has certain rights in this invention.

TECHNICAL FIELD

The present invention relates generally to test instrumentation, and more particularly to a testbed for testing broadband wireless (e.g., radio frequency (RF)) modems and networks.

BACKGROUND OF THE INVENTION

Benchtop testing is required prior to fielding an ad-hoc wireless network. An ad-hoc network often consists of a large number of RF modems making up the nodes of the network. A test setup must be scalable and rapidly configurable to test differing numbers of nodes and ad-hoc scenarios. The topologies must reflect a reasonable subset of all possible ad-hoc topologies while sufficiently stressing the capability of the network in order to obtain a high degree of confidence that the network and modems are working correctly.

Current testing methods typically range from simply setting up the test in an open air environment to connecting the wireless equipment together via cables, to assembling test setups disposed within RF shielded rooms. Although open air test setups have the advantage of being simple to construct, they typically suffer from a variety of problems. First, the open air environment is difficult to control. It is not possible to precisely control signal levels and test topologies in order to verify protocol implementation. Often, due to intermittent interference, specific tests cannot be repeated with consistent results. Second, each test setup takes up at least one radio channel and because radio channels are regulated and allotted by the government they are a scarce resource. Thus, an active test lab may use all of the allotted channels for one test setup thereby preventing multiple independent test setups from operating simultaneously and preventing multiple engineers or production workers from working side by side.

One way to overcome the limitations of the open air test setup is by connecting the test setup to wireless equipment through an RF cable system having RF cables, RF combiners and RF attenuators. Using this approach, transmitter signals can be communicated to the wireless system receivers via the RF cable system. Not only does this allow the signal power levels to be controlled using RF attenuators, but the setup can support flexible network topologies in a controlled environment under repeatable test conditions.

Nevertheless, there still are shortcomings associated with conventional test setups using RF cables, combiners and attenuators. For example, for robust testing path loss with fading channels should be simulated across various node to node routes. Path loss variations should be rapidly switchable to speeds approaching the required fading correlation times. Moreover, the test setup should not allow undesired crosstalk to occur between the modem/nodes. Furthermore, the test setup must be automatable for repeatability and accuracy. Conventional test systems fail to address such combination of shortcomings.

In view of the above, there is a strong need in the art for a test setup for testing broadband wireless modems and networks. More specifically, there is a strong need for a test setup which can simulate path loss with fading channels across various node to node routes. There is a strong need for a test setup which can rapidly switch path loss variations at speeds approaching required fading correlation times. Moreover, there is a strong need for a test setup that avoids undesired crosstalk and that is automatable for repeatability and accuracy.

SUMMARY OF THE INVENTION

The present invention provides a broadband wireless modem and network testbed that offers rapid switchability, repeatability and accuracy. The testbed utilizes a bus-mesh network topology, and more preferably a bus-mesh-bus network topology. The variable legs of the resultant network are controlled using digital attenuators running files and/or algorithms that implement (i.e., simulate) the desired path loss and fading environments. Fixed and/or adjustable attenuators may serve to provide additional attenuation with the network.

Various numbers of nodes may be tested in a given multi-node testbed in accordance with the present invention. This is advantageous particularly since a full suite of units to be tested may not be available. The available units may still undergo testing. Highly shielded coaxial cables interconnect the nodes, and signals may be strongly attenuated prior to entering the mesh to reduce crosstalk.

According to one particular aspect of the invention, a testbed is provided for testing broadband wireless test units. The testbed includes an enclosure; a plurality of I/O connectors accessible externally of the enclosure, each of the I/O connectors for being electrically coupled to a respective test unit; and a series of connections within the enclosure which serve to interconnect the plurality of I/O connectors as respective nodes in a bus-mesh network topology.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout.

Figure 1:
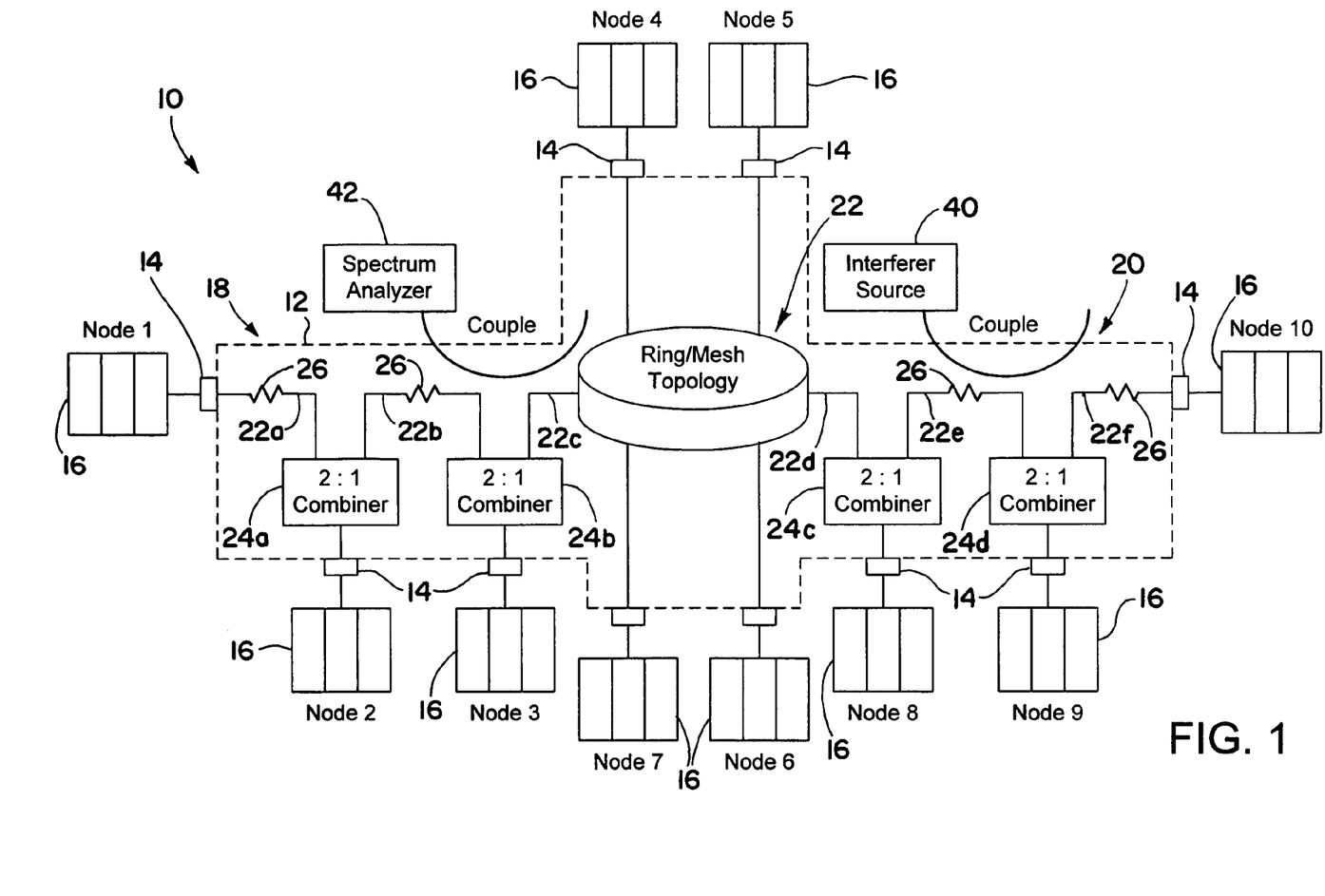
FIG. 1 is a general diagram of a broadband wireless testbed having a bus-mesh-bus topology in accordance with an exemplary embodiment of the present invention.

Referring to FIG. 1, a testbed 10 is shown for testing broadband wireless test units in accordance with an exemplary embodiment of the present invention. The testbed 10 includes an enclosure 12 having a plurality of input/output (I/O) connectors 14 accessible externally of the enclosure 12. Each of the I/O connectors 14 serves to electrically couple a respective test unit 16 to the testbed 10. As will be explained in more detail below, the testbed 10 further includes a series of connections within the enclosure 12 which serve to interconnect the plurality of I/O connectors 14, and hence the respective test units 16, as respective nodes in a bus-mesh network topology. More preferably, the series of connections serve to interconnect the plurality of I/O connectors 14, and hence the respective test units 16, in a bus-mesh-bus network topology.

The testbed 10 provides rapid switchability, repeatability and accuracy in testing the ad-hoc connectability of test units 16. The testbed 10 utilizes a combination of RF cables, combiners and attenuators to form a bus-mesh network topology, and more preferably a bus-mesh-bus network topology. In the exemplary embodiment, the variable legs within the network are controlled using digital attenuators running files and/or algorithms that implement (i.e., simulate) desired path loss and fading environments. The digital attenuators also may serve to provide general attenuation with the network. A various number of nodes may be tested in a given testbed 10. It is not necessary that a full suite of test units 16 be available. The available test units 16 may still undergo testing. The bus-mesh network topology serves as a useful minimum configuration which allows the testbed 10 to be configured in a variety of ad-hoc configurations. Still further, the bus-mesh-bus network topology provides a basic configuration with an even wider variety of possible ad-hoc configurations.

The particular embodiment shown in FIG. 1 is a ten-node testbed 10 to which up to ten test units 16 may be connected. It will be appreciated, however, that the present invention is not limited to any particular number of nodes, and may be modified to include fewer or more than ten nodes without departing from the scope of the invention.

As is shown in FIG. 1, the testbed 10 includes a bus topology 18 and a bus topology 20 coupled on opposite sides of a ring/mesh topology 22. The bus topologies 18 and 20 each represent a common bus having two or more test units 16 connected thereto. For example, bus topology 18 is made up of wired connections 22a, 22b and 22c coupled together with combiners 24a and 24b. One end of wired connection 22a is terminated at I/O connector 14 representing Node 1 of the testbed 10. The other end of wired connection 22a is coupled to one terminal of 2:1 combiner 24a. One end of wired connection 22b is coupled to another terminal of the combiner 24a, and the other end is coupled to a terminal of 2:1 combiner 24b. One end of wired connection 22c is coupled to another terminal of the combiner 24b, and the other end is coupled to the ring/mesh topology 22. The combination terminal of the combiner 24a is terminated at I/O connector 14 representing Node 2, and the combination terminal of the combiner 24b is coupled to the I/O connector 14 representing Node 3. In-line attenuators 26 may be included within the wired connections as desired. Similarly, bus topology 20 is made up of wired connections 22d, 22e and 22f. These wired connections, in combination with 2:1 combiners 24c and 24d, couple Nodes 8, 9 and 10 to bus topology 20.

Figure 2:
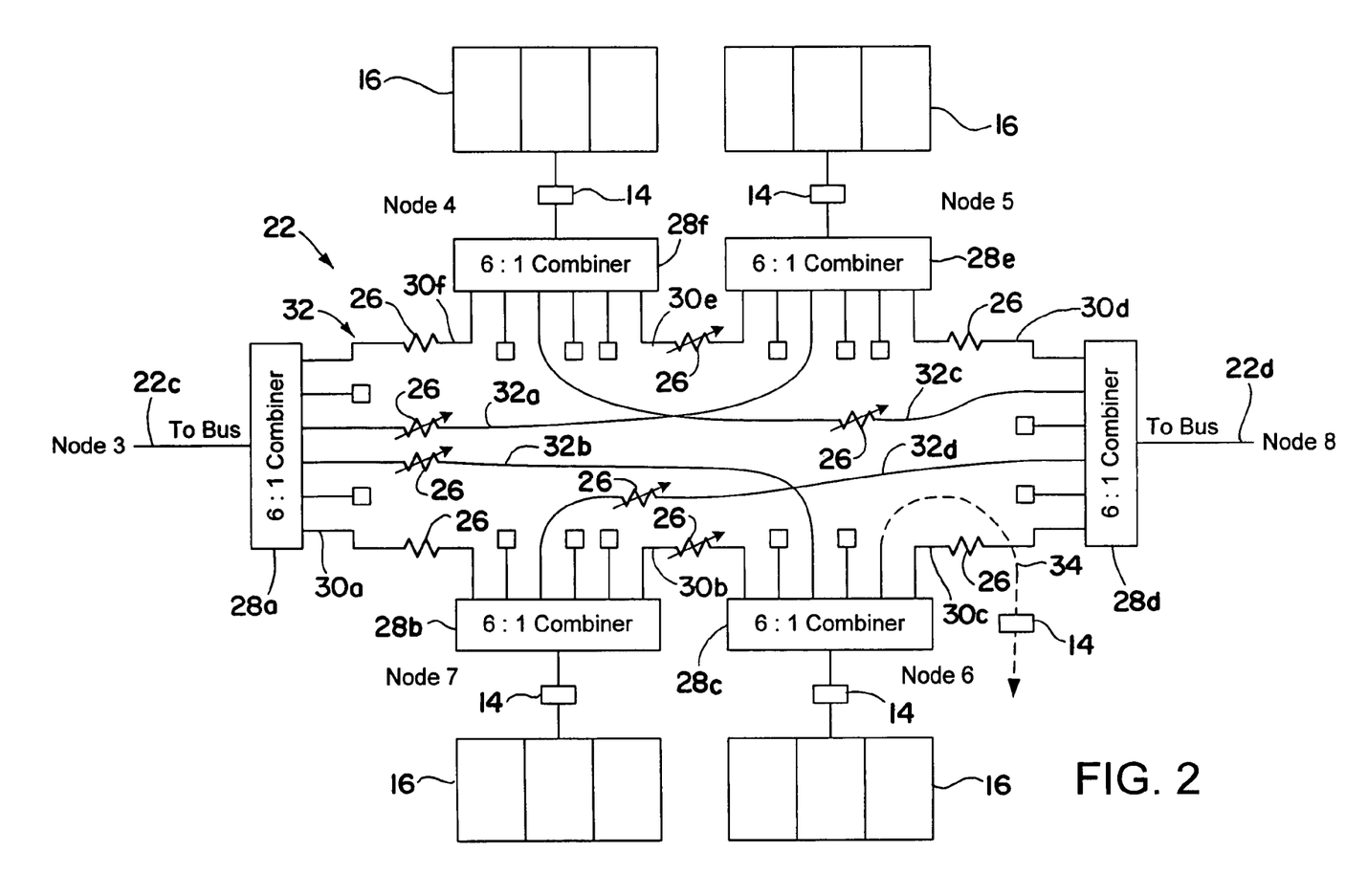
FIG. 2 is a schematic diagram illustrating the mesh topology within the testbed of FIG. 1 in accordance with an exemplary embodiment of the present invention.

FIG. 2 illustrates the exemplary ring/mesh topology 22 in accordance with the present invention. A series of six 6:1 combiners 28a thru 28f are interconnected via wired connections 30a thru 30f to form an outer ring network 30. More specifically, wired connection 30a couples respective terminals of combiners 28a and 28b. Wired connection 30b couples combiners 28b and 28c, wired connection 30c couples combiners 28c and 28d, and wired connection 30d couples combiners 28d and 28e. Finally, wired connection 30e couples combiners 28e and 28f, and wired connection 30f connects combiners 28f and 28a to complete the ring. The combination terminal of combiner 28a is coupled to Node 3 via wired connection 22c, and the combination terminal of combiner 28d is coupled to Node 8 via wired connection 22d. The combination terminals of combiners 28b, 28c, 28e and 28f are coupled to respective I/O connectors 14 representing Nodes 7, 6, 5 and 4, respectively.

The ring/mesh topology 22 is generally referred to herein as a mesh topology. Such mesh topology may consist simply of a ring, a multiple-leg configuration, or a combination thereof. The present invention contemplates each and every one of these arrangements without departing from the scope of the invention.

In the embodiment of FIG. 2, multiple legs are included within the ring structure. More specifically, wired connection 32a couples respective terminals of combiner 28a to combiner 28e. Similarly, wired connection 32b connects combiner 28a to combiner 28c. Wired connection 32c connects combiner 28d to combiner 28f, and wired connection 32d connects combiner 28b to combiner 28d. Furthermore, the various wired connections again may include in-line attenuators 26 for providing desired attenuation. Moreover, some or all of the attenuators 26 may be digitally controlled attenuators controlled by preprogrammed algorithm(s) to provide rapid switchability, repeatability and accuracy in tests conducted using the testbed 10. Digitally controlled attenuators 26 are noted in the figures by an arrow through the attenuator as is conventional.

As will be appreciated from the above description of FIGS. 1 and 2, the testbed 10 provides a ten-node testbed in which Nodes 1, 2 and 3 are connected via a first bus topology 18. Moreover, Nodes 3, 4, 5, 6, 7 and 8 are connected via a ring/mesh topology 22, with Nodes 3 thru 8 being on a ring, and Nodes 3-5, 3-6, 4-8 and 7-8 being directly interconnected. Nodes 8, 9 and 10 are connected via the second bus topology 20. Different topologies will be readily apparent to those having ordinary skill in the art without departing from the scope of the invention.

Unused terminals of the combiners 24 and 28 can be terminated with appropriate loads to avoid impedance mismatches, interference, etc., as will be appreciated. In addition, one or more unused terminals of the combiners 24 and/or 28 may be used to interconnect the testbed 10 with one or more other testbeds in order to expand the number of possible nodes as will be appreciated. For example, FIG. 2 illustrates a phantom arrow 34 which may be used to connect the testbed 10 to another testbed via a wired connection through an I/O connector 14 in the enclosure 12 (not shown in FIG. 2). Although not shown in FIGS. 1 and 2, the unused terminals of the combiners 24 and/or 28 can be coupled to I/O connectors 14 also included in the enclosure (see FIG. 4 below). Appropriate loads are coupled to the connectors 14 when the I/O terminal 14 is not in use. When it is desired to couple another device to a node and/or use the terminal to couple the testbed 10 to another testbed, the load may be removed and the connector 14 serves as an easy connection point for the desired topology.

In the exemplary embodiment, the enclosure 12 preferably represents a direct connect integration test box with extensive RF shielding (e.g., Faraday shielding). The shielding avoids interference from outside the enclosure from entering, and likewise avoids any interference from within the enclosure from emanating outword. Referring again to FIG. 1, the testbed 10 may be used in conjunction with an interference source 40 and/or spectrum analyzer 42 located in or near the testbed 10 for analyzing the effects and/or occurrence of interference within the network under test.

Each of the wired connections 22 and 32 preferably are made up of highly shielded coaxial cables which interconnect the nodes. For example, the wired connections 22 and 32 may be made up of triple-shielded coaxial cable as is known in the art. The signals from the test units 16 may be strongly attenuated prior to entering the buses 18 and 20 and/or mesh 22 to reduce crosstalk.

The test units 16 may be any type of test unit without departing from the scope of the invention. In the exemplary embodiment, the test units 16 are broadband wireless modems for use in respective terminals in a wireless ad-hoc network. In the exemplary embodiments described herein, the test units 16 are each a mobile radio, each of which may be tested as part of the test routine.

As will be discussed in more detail with respect to FIG. 5, the digital attenuators 26 provide controllable connectivity between two or more nodes. A controller (discussed below in relation to FIG. 4) controls the attenuation of the digital attenuators 26 during a test to simulate, for example, path loss with fading channels within a wireless network. The controller may be programmed to change the attenuation of the digital attenuators 26 at frequencies approaching predefined fading correlation times. For example, the controller may change the attenuation of the digital attenuators 26 on an order of every ten seconds or less. Moreover, the controller may change the attenuation of the digital attenuators in increments of approximately 1 decibel, for example. It will be appreciated, however, that such times and values are merely exemplary and may be virtually any time or value without departing from the scope of the invention.

Figure 3:
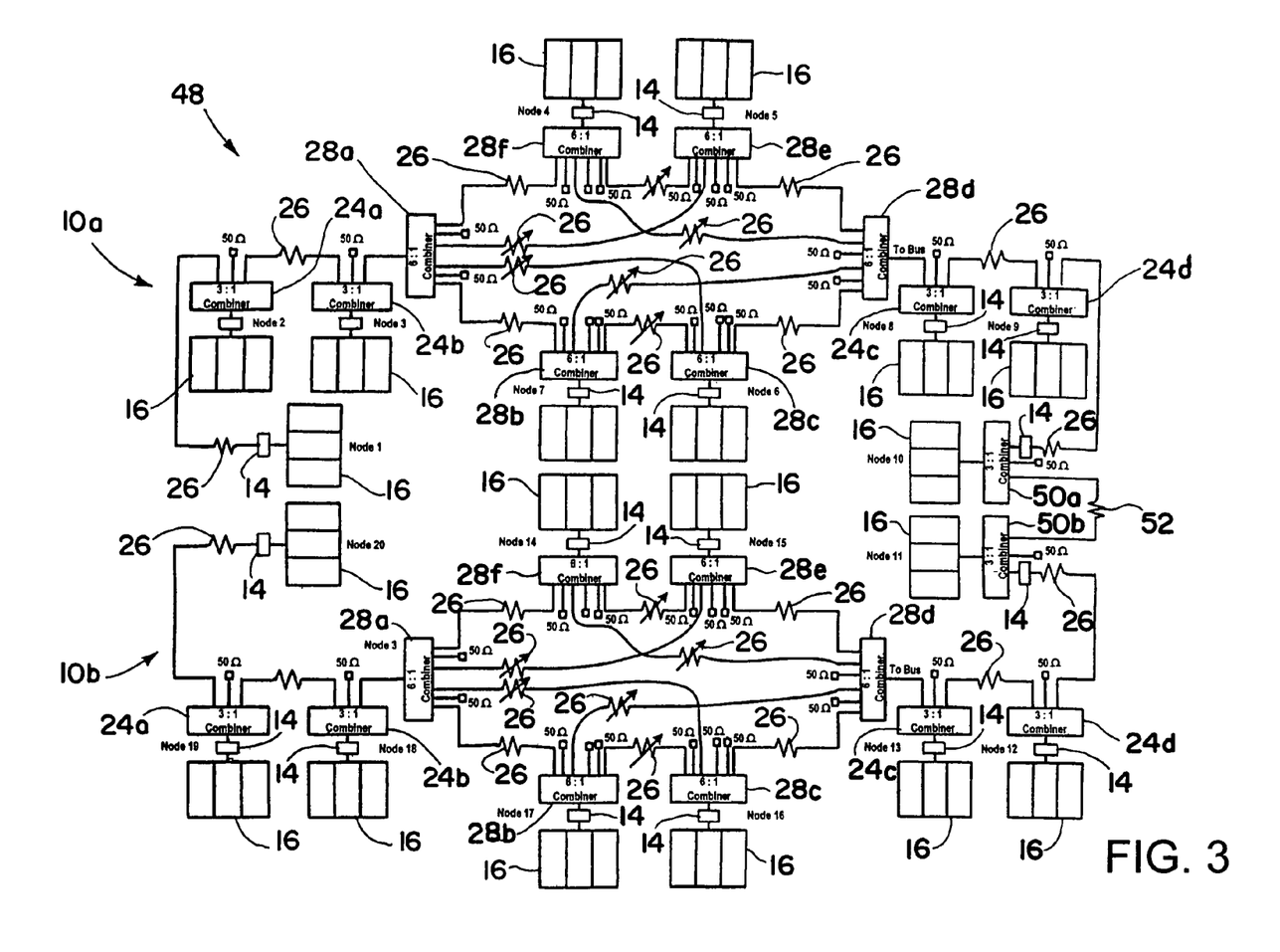
FIG. 3 is a schematic illustration of two ten-node testbeds combined to form a twenty-node test in accordance with an exemplary embodiment of the present invention.

Referring now to FIG. 3, the combinability of a testbed in accordance with the present invention is shown. Specifically, two ten-node testbeds 10a and 10b having the same general configuration as the testbed 10 of FIGS. 1 and 2 are combined to form a twenty-node testbed 48. Each of the ten-node testbeds 10a and 10b differ from the testbed 10 of FIGS. 1 and 2 only in that 3:1 combiners 24a thru 24d, with a load terminating the unused terminal, are substituted in place of the 2:1 combiners 24a thru 24d in FIGS. 1 and 2.

The testbeds 10a and 10b are combined by a pair of 3:1 combiners 50a and 50b and a coupling attenuator 52. Specifically, the I/O connector 14 to which the test unit 16 representing node 10 of testbed 10a is normally coupled to is instead coupled to a terminal of 3:1 combiner 50a. Another terminal of combiner 50a is coupled through the coupling attenuator 52 to a terminal of combiner 50b. Another terminal of combiner 50b is coupled to the I/O connector 14 to which another test unit 16 representing node 1 of testbed 10b is normally connected. The combined terminals of the combiners 50a and 50b are coupled to respective test units 16. The test unit 16 coupled to combiner 50a thereby becomes Node 10 of the twenty-node testbed 48, and the test unit 16 coupled to the combiner 50b becomes Node 11. Thus, by simply coupling the I/O connectors 14 as shown two ten-node testbeds in accordance with the present invention can be combined to form a twenty-node testbed 48 having a bus-mesh-bus-mesh-bus network topology. Additional testbeds may be combined as desired.

Although FIG. 3 shows two testbeds 10a and 10b combined between nodes included within the bus network topology of each testbed, it will be appreciated that connections can be made via any of the nodes within the testbeds. For example, connection may be between the mesh topology of each testbed, the bus topology of each testbed as in FIG. 3, or the mesh topology of one testbed and the bus topology of another testbed as will be appreciated.

In this manner, the unused I/O connectors 14 coupled to the unused terminals of the combiners in each testbed 10 may serve as an expansion connectors accessible externally of the enclosure. The expansion connectors provide a connection to at least one of the bus and mesh to permit an additional testbed to be coupled to the testbed. The connector may provide a connection to the bus (e.g., an otherwise unused terminal of any of combiners 24a thru 24d), or a connection to the mesh (e.g., an otherwise unused terminal of any of the combiners 28a thru 28f).

Furthermore, it will be appreciated that the unused I/O connectors 14 coupled to the unused terminals of the combiners in each testbed 10 may be connected external of the enclosure 12 to each other via coaxial cabling or the like. This permits a user to further configure the topology within the testbed by adding one or more additional connection points within the bus-mesh-bus topology.

Figure 4:
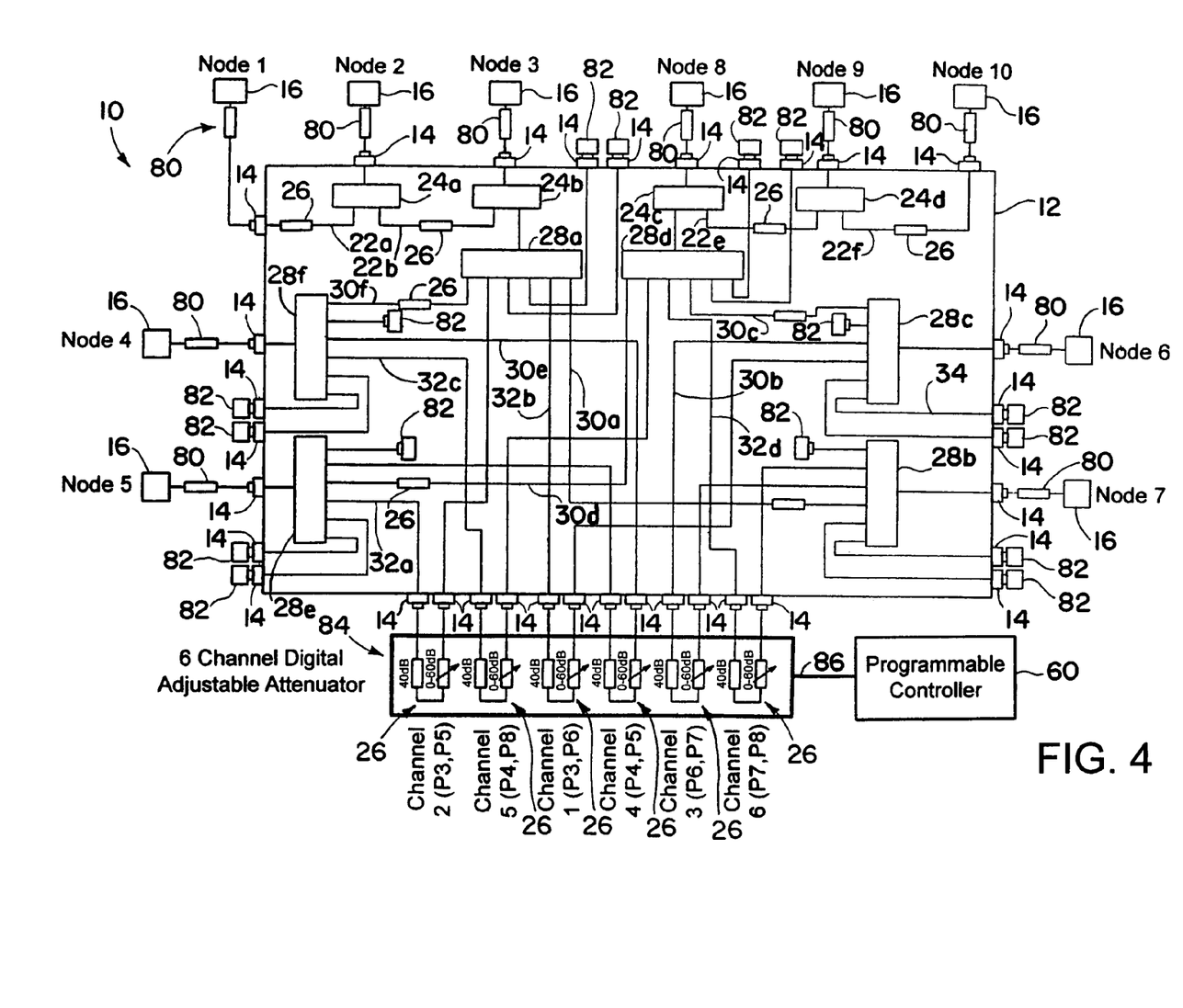
FIG. 4 is a detailed schematic of a ten-node testbed in accordance with an exemplary embodiment of the present invention.
Figure 5A:
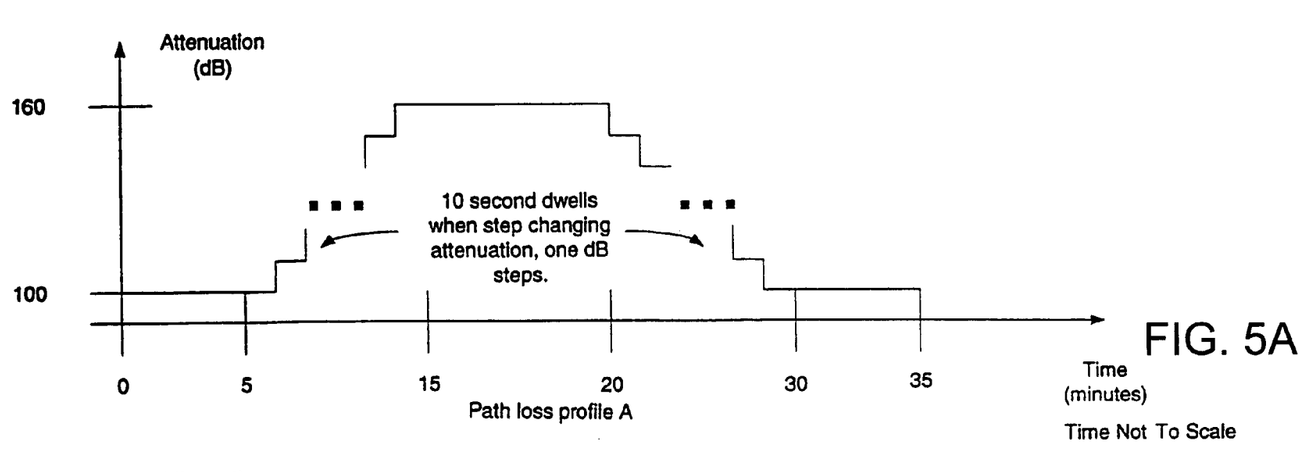
FIGS. 5A and 5B represent different path loss profiles which may be carried out automatically by the testbed in accordance with an exemplary embodiment of the invention.
Figure 5B:
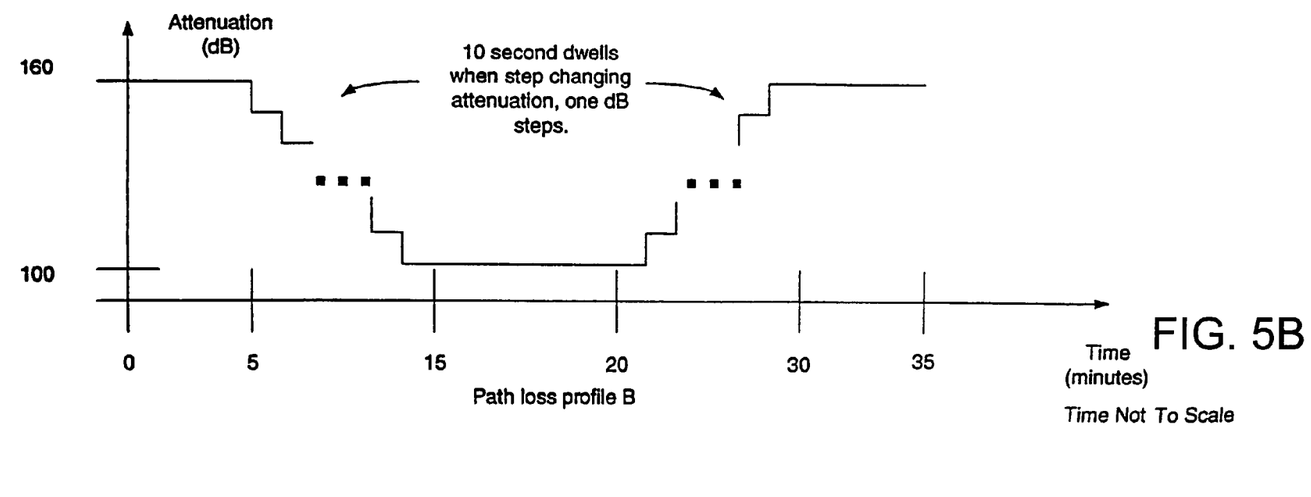

FIG. 4 illustrates a particular embodiment of a testbed system utilizing a testbed 10 having a general configuration as shown in FIGS. 1 and 2, together with a programmable controller 60. As is shown in FIG. 4, each test unit 16 is coupled through a high power attenuator 80 to its corresponding I/O connector 14. The attenuators 80 serve to reduce the level of RF energy which enters the enclosure 12, thereby reducing the amount of RF interference therein. It is noted that the majority of unused terminals from the combiners 28a thru 28f are coupled via triple-shielded coaxial cable to respective I/O connectors 14 accessible from outside the shielded enclosure 12. As discussed above, all of the unused terminals from the combiners are terminated with a matching load 82.

In the embodiment of FIG. 4, the adjustable attenuators 26 are represented by a six channel digital adjustable attenuator 84 located outside of the enclosure 12. Appropriate I/O connectors 14 are provided on the exterior of the enclosure 12 to allow coupling of the attenuator 84 via appropriate cabling and connectors as will be appreciated. The various channels of the attenuator 84 are controlled by the programmable controller 60 which carries out desired attenuation of the digital attenuators during testing.

For example, the controller 60 controls the attenuation of the digital attenuators 26 during a test to simulate path loss with fading channels within a wireless network. As represented in FIGS. 5A and 5B, the controller 60 changes the attenuation of the digital attenuators at frequencies approaching predefined fading correlation times. For example, the controller 60 may change the attenuation of the digital attenuators 26 on an order of every ten seconds or less and at increments of approximately 1 decibel. It will be appreciated, however, that other profiles, increments, timing, etc. may be used for each of the digital attenuators 26 as desired without departing from the scope of the invention.

Further, another embodiment of the invention may include the digital attenuators 26 (e.g., via attenuator 84) located within the enclosure 12. Control lines 86 from the controller 60 may be connected via an appropriate connector to the attenuator 84 within the enclosure 12.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A testbed for testing broadband wireless test units, comprising:
   an enclosure;
   a plurality of I/O connectors accessible externally of the enclosure, each of the I/O connectors for being electrically coupled to a respective test unit; and
   a series of connections within the enclosure which serve to interconnect the plurality of I/O connectors as respective nodes in a bus-mesh network topology configured to simulate path loss with fading channels across various node routes, and to provide for rapid switching of path loss variations while precluding undesirable cross talk among the test units.

2. The testbed of claim 1, wherein the series of connections serve to interconnect the plurality of I/O connectors in a bus-mesh-bus network topology.

3. The testbed of claim 1, further comprising a plurality of digital attenuators for providing controllable connectivity between two or more nodes.

4. A testbed system comprising:
   a testbed in accordance with claim 3; and
   a controller coupled to the plurality of digital attenuators for controlling the attenuation of the digital attenuators during testing,
   wherein the controller controls the attenuation of the digital attenuators during a test to simulate path loss with fading channels within a wireless network.

5. The testbed system of claim 4, wherein the controller changes the attenuation of the digital attenuators at frequencies approaching predefined fading correlation times.

6. The testbed system of claim 4, wherein the controller changes the attenuation of the digital attenuators on an order of every ten seconds or less.

7. The testbed system of claim 6, wherein the controller changes the attenuation of the digital attenuators in increments of approximately 1 decibel.

8. The testbed system of claim 4, wherein the controller is programmable.

9. The testbed of claim 3, wherein the two or more nodes are included within the mesh.

10. The testbed of claim 1, further comprising:
    at least one expansion connector accessible externally of the enclosure, the at least one expansion connector providing a connection to at least one of the bus and mesh to permit an additional test bed to be coupled to the test bed.

11. The testbed of claim 10, wherein the at least one expansion connector provides a connection to the bus.

12. The testbed of claim 10, wherein the at least one expansion connector provides a connection to the mesh.

13. The testbed of claim 1, wherein the mesh comprises a ring topology and a plurality of connections traversing nodes on the ring.

14. The testbed of claim 1, wherein the plurality of connections traversing the node on the ring include a digital attenuator.

15. The testbed of claim 1, wherein the mesh is a ring.

16. The testbed of claim 1, wherein each in the series of connections comprises a shielded coaxial cable.

17. The testbed of claim 16, wherein the shielded coaxial cable is a tripley shielded coaxial cable.

18. The testbed of claim 1, wherein the enclosure comprises a Faraday shielded case.

19. The testbed of claim 1, further comprising a power attenuator interposed between each I/O connector and the respective test unit.

* * * * *

UNITED STATES PATENT AND TRADEMARK OFFICE
CERTIFICATE OF CORRECTION

PATENT NO.         : 7,532,863 B2
APPLICATION NO. : 10/972873
DATED                 : May 12, 2009
INVENTOR(S)       : Michael S. Bielas, Matthew R. Danner and Brian T. MacIntosh

Page 1 of 1

It is certified that error appears in the above-identified patent and that said Letters Patent is hereby corrected as shown below:

On the Title Page Item [75]: under "Inventor", "Mathew R. Danner" should read -- Matthew R. Danner --

Signed and Sealed this

Twenty-fifth Day of August, 2009

David J. Kappos
*Director of the United States Patent and Trademark Office*